(12) United States Patent
Luo et al.

(10) Patent No.: US 11,314,425 B2
(45) Date of Patent: Apr. 26, 2022

(54) READ ERROR RECOVERY

(71) Applicant: Micron Technology, Inc., Boise, ID (US)

(72) Inventors: Xiangang Luo, Fremont, CA (US); Harish Reddy Singidi, Fremont, CA (US); Ting Luo, Santa Clara, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/051,961

(22) PCT Filed: May 7, 2019

(86) PCT No.: PCT/US2019/031164
§ 371 (c)(1),
(2) Date: Oct. 30, 2020

(87) PCT Pub. No.: WO2019/217454
PCT Pub. Date: Nov. 14, 2019

(65) Prior Publication Data
US 2021/0132823 A1 May 6, 2021

Related U.S. Application Data (60) Provisional application No. 62/668,768, filed on May 8, 2018.

(51) Int. Cl.
*G06F 3/06* (2006.01)
(52) U.S. Cl.
CPC .......... *G06F 3/0619* (2013.01); *G06F 3/0653* (2013.01); *G06F 3/0679* (2013.01)

(58) Field of Classification Search
CPC .... G06F 3/0619; G06F 3/0653; G06F 3/0679; G06F 11/1048; G06F 11/1068; G11C 16/0483; G11C 16/26; G11C 29/52
See application file for complete search history.

(56) References Cited

U.S. PATENT DOCUMENTS 9,026,887 B2  5/2015  Manning et al.
9,092,350 B1  7/2015  Jeon et al.
(Continued)

FOREIGN PATENT DOCUMENTS

CN    112262436      1/2021
WO    WO-2019217454 A1   11/2019

OTHER PUBLICATIONS

"International Application Serial No. PCT US2019 031164, International Preliminary Report on Patentability dated Nov. 19, 2020", 8 pgs.

(Continued)

*Primary Examiner* — Hiep T Nguyen
(74) *Attorney, Agent, or Firm* — Schwegman Lundberg & Woessner, P.A.

(57) ABSTRACT

Systems and methods are disclosed, including maintaining an error recovery data structure for a set of codewords (CWs) in a storage system and performing error recovery for the set of CWs using a set of error handing (EH) steps until each CW of the set of CWs are indicated as correctable in the error recovery data structure. The error recovery can include determining if each CW of the set of CWs is correctable by an EH step, storing indications of CWs determined correctable by the EH step in the error recovery data structure, determining if one or more CW in the set of CWs are not indicated as correctable in the error recovery data structure, and, in response to determining that one or more CW in the set of CWs are not indicated as correctable (Continued)

in the error recovery data structure, incrementing the specific EH step.

19 Claims, 5 Drawing Sheets

(56) References Cited

U.S. PATENT DOCUMENTS

| | | |
|---|---|---|
| 10,135,465 B2 | 11/2018 | Parthasarathy et al. |
| 2009/0172501 A1 | 7/2009 | Lablans |
| 2011/0296272 A1* | 12/2011 | Rub .................... G06F 11/1012 |
| | | 714/755 |
| 2014/0047298 A1 | 2/2014 | Radke |
| 2016/0227049 A1* | 8/2016 | Okada .................. G03G 15/502 |
| 2017/0235633 A1 | 8/2017 | Park |
| 2018/0013451 A1 | 1/2018 | Kaynak et al. |
| 2020/0356679 A1* | 11/2020 | Cooke ................. H04L 67/1097 |
| 2021/0026560 A1* | 1/2021 | Pillai .................... G06F 3/0659 |

OTHER PUBLICATIONS

"International Application Serial No. PCT/US2019/031164, International Search Report dated Aug. 27, 2019", 5 pgs.
"International Application Serial No. PCT/US2019/031164, Written Opinion dated Aug. 27, 2019", 6 pgs.

* cited by examiner

READ ERROR RECOVERY

CLAIM OF PRIORITY

This application is a U.S. National Stage Application under 35 U.S.C. 371 from International Application No. PCT/US2019/031164 filed May 7, 2019, published as WO 2019/217454, which claims the benefit of priority under 35 U.S.C. § 119(e) of U.S. Provisional Patent Application Ser. No. 62/668,768, filed on May 8, 2018, all of which are herein incorporated by reference in their entirety

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

A host system can include a host device including a host processor and a first amount of host memory (e.g., main memory, often volatile memory, such as DRAM) to support the host processor, and one or more storage systems (e.g., often non-volatile memory, such as flash memory) that provide additional storage to retain data in addition to or separate from the host memory.

A storage system, such as a solid-state drive (SSD), can include a memory controller and one or more memory devices, including multiple (e.g., multiple) memory dies or logical units (LUNs). In certain examples, each memory die can include multiple memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host device in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Software (e.g., programs), instructions, operating systems (OS), and other data are typically stored on storage systems and accessed by main memory for use by the host processor. Main memory (e.g., RAM) is typically faster, more expensive, and a different type of memory (e.g., volatile) than a majority of the memory devices of the storage system (e.g., non-volatile, such as an SSD, etc.). In addition to the main memory, host systems can include different forms of volatile memory, such as a group of static memory (e.g., a cache, often SRAM), often faster than the main memory, in certain examples, configured to operate at speeds close to or exceeding the speed of the host processor, but with lower density and higher cost.

BRIEF DESCRIPTION OF THE DRAWINGS

The present disclosure is illustrated by way of example and not limitation in the figures of the accompanying drawings, in which like references indicate similar elements.

DETAILED DESCRIPTION

Aspects of the present disclosure are directed to error correction in storage systems, and determining one or more error handing (EH) steps, for example, where a single EH step may not recover multiple codewords (CWs) of a storage system, even though multiple EH steps may recover each of the multiple CWs. The present inventors have recognized, among other things, systems and methods to determine an EH sequence to recover data in the storage system.

Control circuitry of modern storage systems (e.g., including memory or device controllers, etc.), particularly non-volatile memory devices (e.g., NAND flash devices, etc.), perform a number of management functions in addition to traditional read, program, and erase operations. Management functions may include, among others, data relocation, wear leveling, garbage collection, error detection and correction, etc. Data is frequently relocated, such as to refresh stored data or otherwise manage data in the storage system.

In certain examples, a logical block address (LBA) of the stored data can remain static, while a physical address (PA) of the stored data may change. The relationship between the LBA and the physical address can be maintained using logical-to-physical (L2P) information in an L2P data structure (e.g., an L2P map, table, etc.), typically in volatile memory (e.g., static memory, such as static random-access memory (SRAM), cache, etc.) of the storage system, such as to speed access to the physical address on the storage system given a particular LBA. Whereas the L2P data structure can be used to identify the PA of a specific LBA, a physical-to-logical (P2L) data structure (e.g., table, etc.) can be used to identify the LBA of a particular PA. The L2P information in the L2P data structure (and in certain examples, P2L information in the P2L data structure) is commonly referred to as the flash translation layer (FTL).

In an example, control circuitry of the storage system (e.g., a memory or device controller of the storage system) can be configured to manage portions of the non-volatile memory in one or more regions or subregions. L2P regions and subregions can be ranges in the logic space. For example, a 64 GB storage system can be divided into 64 1 GB regions. A 1 GB region can be divided into 16 subregions of 64 MB. If each LBA is 4 kB of data, a subregion can be formed by 16,384 consecutive LBA, and a region can be formed by 262,144 consecutive LBA. Such numbers, ranges, and sizes are illustrative, and in other examples, other numbers, ranges, and sizes can be used. Active regions or subregions can include regions or subregions currently managed by the control circuitry.

Many storage systems write data in pages and erase data in blocks. Each block contains multiple (e.g., hundreds, thousands, etc.) pages. Further, many storage systems require a page of non-volatile memory to be erased before it can be programmed again. Accordingly, all pages in a block must be ready for erasure (e.g., containing invalid data, already having moved valid data, etc.) before the block can be erased. In addition, non-volatile memory cells have a specific number of program/erase cycles they can tolerate before they are retired, and erase operations take more time than program operations (e.g., ~50×, etc.), and much more than read operations (e.g., ~500×, etc.). Such ratios are illustrative, not restrictive, and may vary. As used herein, a group of memory cells can include a page of memory cells, or one or more other groups, such as a block, etc.

When information stored in a page requires update, a storage system can mark the page as invalid and write updated information to a new, empty page, updating address information to direct subsequent operations to the new page. The original page may eventually be erased once the remaining pages in the block are marked invalid, the remaining valid data has been moved (e.g., and the L2P information has been updated), or some combination thereof. Similarly, information marked for deletion is often marked invalid, but retained until all information in the block can otherwise be erased.

Storage systems may experience one or more errors during operation. For example, memory cell performance may degrade after repeated program, read, or erase operations. Errors may also be introduced during operation of the storage system. Reading data from memory cells in a block of memory cells may cause changes to nearby memory cells (e.g., in surrounding blocks or groups of memory cells), an effect known as read disturbance (read disturb). For example, read disturb errors may occur in response to shifted charge distributions, such as resulting from applied pass-through voltages (Vpass) to memory cells near a memory cell that is being read. If the magnitude of the distribution is large enough, a different value can be read from the memory cell than what was stored.

To ensure reliable data storage and recovery, a storage system can have one or more error detection and correction mechanisms, such as by an error correction unit (ECU) of the control circuitry of the storage system. For example, Error Correction Codes (ECC) can be generated for user data, such as by inputting the user value into a mathematical formula to produce an ECC value or ECC data that is also stored, in certain examples, with the user data. A codeword is a group of user data (k bits) and associated KC data (n bits) including parity data, etc., resulting in a codeword having (k+n) bits. When retrieving user data, the same or complimentary mathematical formula can be applied to the value read from the memory cell or to the ECC value or ECC data. The ECC value or KC data can detect one or more errors in the user data, and in certain examples, can determine the location of the detected error in the user data and correct the detected error.

An example ECC process includes application of block codes, including systemic codes or linear codes such as cyclic, Hamming, parity, or repetition codes, etc. Other example ECC processes include checksums, cyclic redundancy checks (CRCs), cryptographic hashes, convolutional codes, turbo codes, low-density parity check (LDPC), Reed-Solomon codes, Boss-Chaudhuri-Hocquenghern (BCH) codes, etc. Different KC processes can detect different numbers of bit errors in stored data and, in certain examples, identify the location of the detected errors, and correct different numbers of detected bit errors, such as disclosed in the commonly-assigned Radke et al. U.S. Pat. No. 9,262, 261, titled "Memory Devices Facilitating Differing Depths of Error Detection and/or Error Correction Coverage," the disclosure of which is incorporated by reference in its entirety. Error handing (EH) steps may include one or more specific ECC processes, and an EH sequence can include an order of EH steps or a subset of EH steps from larger set of possible EH steps.

Storage systems can implement a variety of EH mechanisms, hardware or software-based, to correct the value read from the memory cell when an error is detected. Different EH mechanisms can target different error conditions. Error conditions can be described with respect to one or more error thresholds. Error thresholds can include a number of detected errors (e.g., bit errors in a group of memory cells), or success or failure of one or more error conditions (e.g., an ECC check, etc.). In an example, read disturb EH mechanisms target read disturb errors, such as by shifting read voltages to compensate for shifts in charge distribution. Multiple EH mechanisms may be tried for a given error. Each EH mechanism may perform different operations and thus may require different amounts of overhead.

In some examples, the storage system may attempt multiple EH mechanisms, or multiple steps of one or more EH mechanisms, to correct detected errors, such as in one or more CWs. The order of such mechanisms can be specified by a predefined EH sequence. EH sequences may be programmed into the device in hardware, software, or a combination of hardware and software at device manufacture time, and may be developed by the manufacturer based upon expected use cases and environments as well as historical expected success rates, latencies, and controller utilization statistics of the various EH mechanisms.

Figure 1:
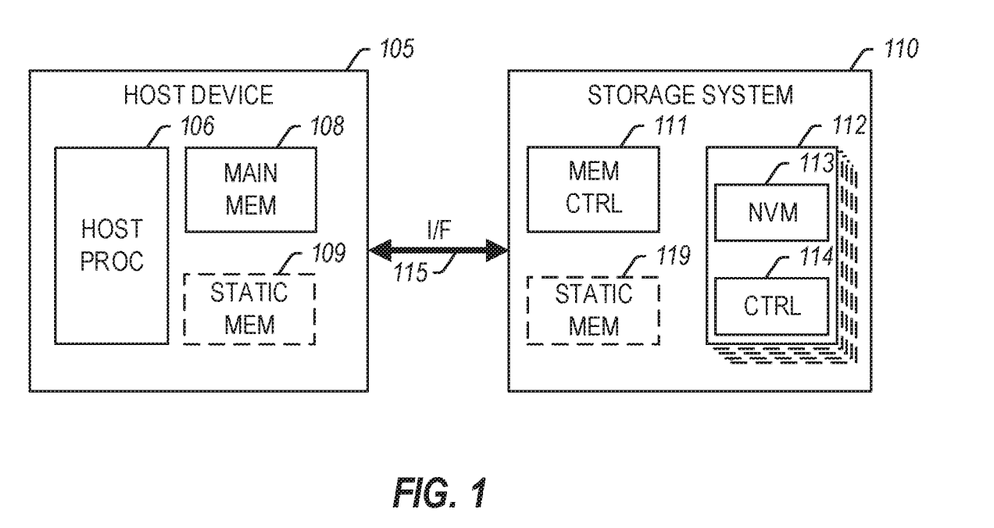
FIG. 1 illustrates an example system including a host device and a storage system.

FIG. 1 illustrates an example system (e.g., a host system) 100 including a host device 105 and a storage system 110 configured to communicate over a communication interface (I/F) 115 (e.g., a bidirectional parallel or serial communication interface). In an example, the communication interface 115 can be referred to as a host interface. The host device 105 can include a host processor 106 (e.g., a host central processing unit (CPU) or other processor or processing circuitry, such as a memory management unit (MMU), interface circuitry, etc.). In certain examples, the host device 105 can include a main memory (MAIN MEM) 108 (e.g., DRAM, etc.) and optionally, a static memory (STATIC MEM) 109, to support operation of the host processor (HOST PROC) 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include multiple parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller (MEM CTRL) 111, a non-volatile memory device 112, and, optionally, a limited amount of static memory 119 to support operations of the memory controller 111. The memory controller 111 can receive instructions from the host device 105, and can communicate with the non-volatile memory device 112, such as to transfer data to (e.g., write or erase) or from (e.g., read) one or more of the memory cells of the non-volatile memory device 112.

In an example, the non-volatile memory device 112 can include multiple non-volatile memory devices (e.g., dies or LUNs), such as one or more stacked flash memory devices (e.g., as illustrated with the stacked dashes underneath the non-volatile memory device 112), etc., each including non-volatile memory (NVM) 113 (e.g., one or more groups of non-volatile memory cells) and a device controller (CTRL) 114 or other periphery circuitry thereon (e.g., device logic, etc.), and controlled by the memory controller 111 over an internal storage-system communication interface (e.g., an Open NAND Flash Interface (ONFI) bus, etc.) separate from the communication interface 115. Control circuitry, as used herein, can refer to one or more of the memory controller 111, the device controller 114, or other periphery circuitry in the storage system 110, the non-volatile memory device 112, etc.

The non-volatile memory 113 (e.g., one or more 3D NAND architecture semiconductor memory arrays) can include multiple memory cells arranged in, for example, multiple devices, planes, blocks, physical pages. A single-level cell (SLC) can represent one bit of data per cell in one of two programmed states (e.g., 1 or 0). A multi-level cell (MLC) can represent two or more bits of data per cell in multiple programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with less (e.g., half) required write time and more (e.g., double) the program/erase (P/E) cycles as a corresponding TLC memory device. Other examples can include other numbers or arrangements.

Each of the host device 105 and the storage system 110 can include a number of receiver, buffer, driver, or other interface circuits (e.g., data control units, sampling circuits, or other intermedia circuits) configured to send, receive, or process data or signals to be communicated over the communication interface 115. Control circuitry of the storage system 110 can include, among other things, circuitry or firmware, such as a number of components or integrated circuits, a memory manager to provide one or more memory management functions (e.g., wear leveling, garbage collection, error counts, block age, erase count, etc.). In an example, control circuitry of the storage system can encode user data, maintain L2P information in one or more management tables, rebuild L2P data structures, maintain group data structures comprising data operations, decode encoded user data, determine a status for one or more groups of memory cells of the storage system, etc.

The memory manager can include, among other things, circuitry or firmware, such as a number of components or integrated circuits associated with various memory management functions, including, among other functions, wear leveling (e.g., garbage collection or reclamation), error detection or correction, block retirement, or one or more other memory management functions. The memory manager can parse or format host commands (e.g., commands received from the host device 105) into device commands (e.g., commands associated with operation of a memory array, etc.), or generate device commands (e.g., to accomplish various memory management functions) for the device controller 114 or one or more other components of the storage system 110.

The memory manager can include a set of management tables configured to maintain various information associated with one or more component of the storage system 110 (e.g., various information associated with a memory array or one or more memory cells coupled to the memory controller 111). For example, the management tables can include information regarding block age, block erase count, error history, or one or more error counts (e.g., a write operation error count, a read bit error count, a read operation error count, an erase error count, etc.) for one or more blocks of memory cells coupled to the memory controller 111. In certain examples, if the number of detected errors for one or more of the error counts is above a threshold, the bit error can be referred to as an uncorrectable bit error. The management tables can maintain a count of correctable or uncorrectable bit errors, among other things. In an example, the management tables can include translation tables, L2P information, the group data structure, etc.

Control circuitry of the storage system 110 can detect or correct errors associated with writing data to or reading data from one or more memory cells of the non-volatile memory device 112. Control circuitry can actively detect and recover from error occurrences (e.g., bit errors, operation errors, etc.) associated with various operations or storage of data, while maintaining integrity of the data transferred between the host device 105 and the storage system 110, or maintaining integrity of stored data (e.g., using redundant array of independent disks (RAID) storage, etc.), and can remove (e.g., retire) failing memory resources (e.g., memory cells, memory arrays, pages, blocks, etc.) to prevent future errors.

Control circuitry can calculate an ECC upon writing a value to the non-volatile memory device 112 and store this value (e.g., in a different location on the non-volatile memory device 112). Upon reading a value from the non-volatile memory device 112, control circuitry can calculate an ECC value for the value read and compare that to the stored ECC value. If the ECC values do not match, control circuitry can determine that an error has occurred.

Control circuitry can track error handling (EH) metrics of one or more ECC processes. Examples include one or more of the number of times the EH mechanisms are needed (e.g., EH_COUNTER), the number of times each particular EH metric is utilized, the number of times each EH mechanism successfully fixes an error, a latency of each EH mechanism, and the like. In certain examples, control circuitry can include a dynamic EH component (e.g., circuitry, processor, dedicated logic, programmable logic, firmware, etc.) to perform the operations described herein, such as one or more scan or fold operations. In some implementations, the EH component can reorder EH sequences during device usage based upon one more observed EH metrics. In certain examples, the dynamic EH component can update the order of the EH mechanisms.

Figure 2:
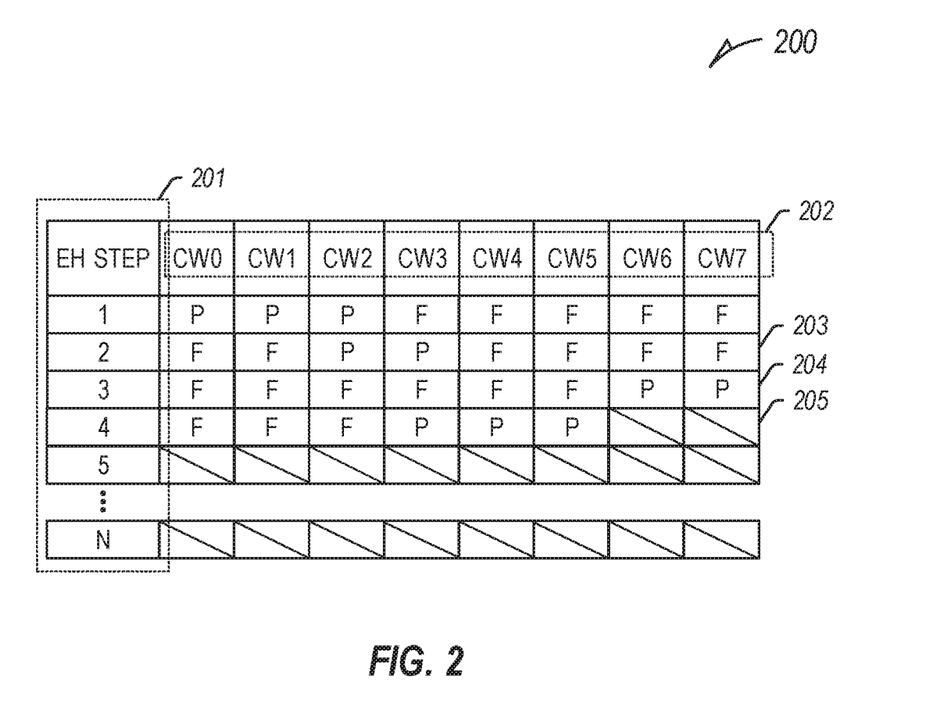
FIG. 2 illustrates an example read error recovery table.

FIG. 2 illustrates an example error recovery data structure 200 (e.g., a read error recovery table, etc.), illustrating multiple error handling (EH) steps (or indices) 201, and multiple codewords (CWs) 202, such as associated with one or more memory operations (e.g., a read command, garbage collection, drive management, etc.). The multiple CWs 202 will either pass (P) (e.g., correctable), such as illustrated at table entry 204, or fail (F) (e.g., uncorrectable), such as illustrated at table entry 203, a specific EH step. In extreme reliability test cases, a single EH step or index may not recover all CWs of one or more groups of data stored in one or more groups of memory cells (e.g., blocks of data, etc.), even though multiple EH steps may cover all CWs. In this example, although each EH step individually fails to recover at least one of the 8 CWs [CW0:CW7], three or four EH steps (e.g., EH1, EH3, and EH4; or EH1-EH4, depending on the search algorithm, etc.) can recover all 8 CWs. In an example, each EH step can represent a different or unique EH process (e.g., a check, code, formula, error handling or recovery procedure, value of a specific mechanism, solution, etc.), or a number of steps in an EH process having different steps, each requiring additional costs. In other examples, the error recovery data structure 200 can include more or less numbers of CWs or EH steps.

In an example, table entry 205 illustrates that a specific EH step was not required (or was not performed) for a respective CW, as one or more previous EH step successfully recovered the respective CW. In an example, the EH steps 201 can include N possible steps. In an example, the EH steps 201 can be performed in order until a pass is determined for each of the different CWs 202. In an example, additional EH steps 201 can be performed after determining a pass for each of the different CWs 202, such as to optimize one or more one or more EH procedures or sequences. In an example, a subsequent order of EH steps 201 to apply can be determined using results from a previous read error recovery process.

In an example, a data structure (e.g., a bitmap) for each CW 202 can be initialized with a first value (e.g., 0 or 1). For each EH step 201, passed CWs can be transferred to one or more buffers (e.g., a respective buffer for each CW, or one or more buffers configured to store corrected CWs, etc.), and a value of the data structure for the specific CW can be changed to a second value (e.g., 1 or 0, respectively), and in certain examples, maintained through multiple steps until re-initialized to the first value. Once the initial value of all CWs in the data structure have been changed to the second value (e.g., from 0 to 1, from a first value to a second value, in a different state, etc.), an EH process or sequence has been determined, and EH determination can be finished.

Although illustrated in FIG. 2 as a table having separate entries for each EH step, in certain examples, the error recovery data structure 200 can include a bitmap having an entry (e.g., a single entry) for each of the set of CWs configured to store, as the EH step is incremented, an indication that each respective CW is correctable by the current EH step or a previous EH step (e.g., changed from an initial value, etc.).

Figure 3:
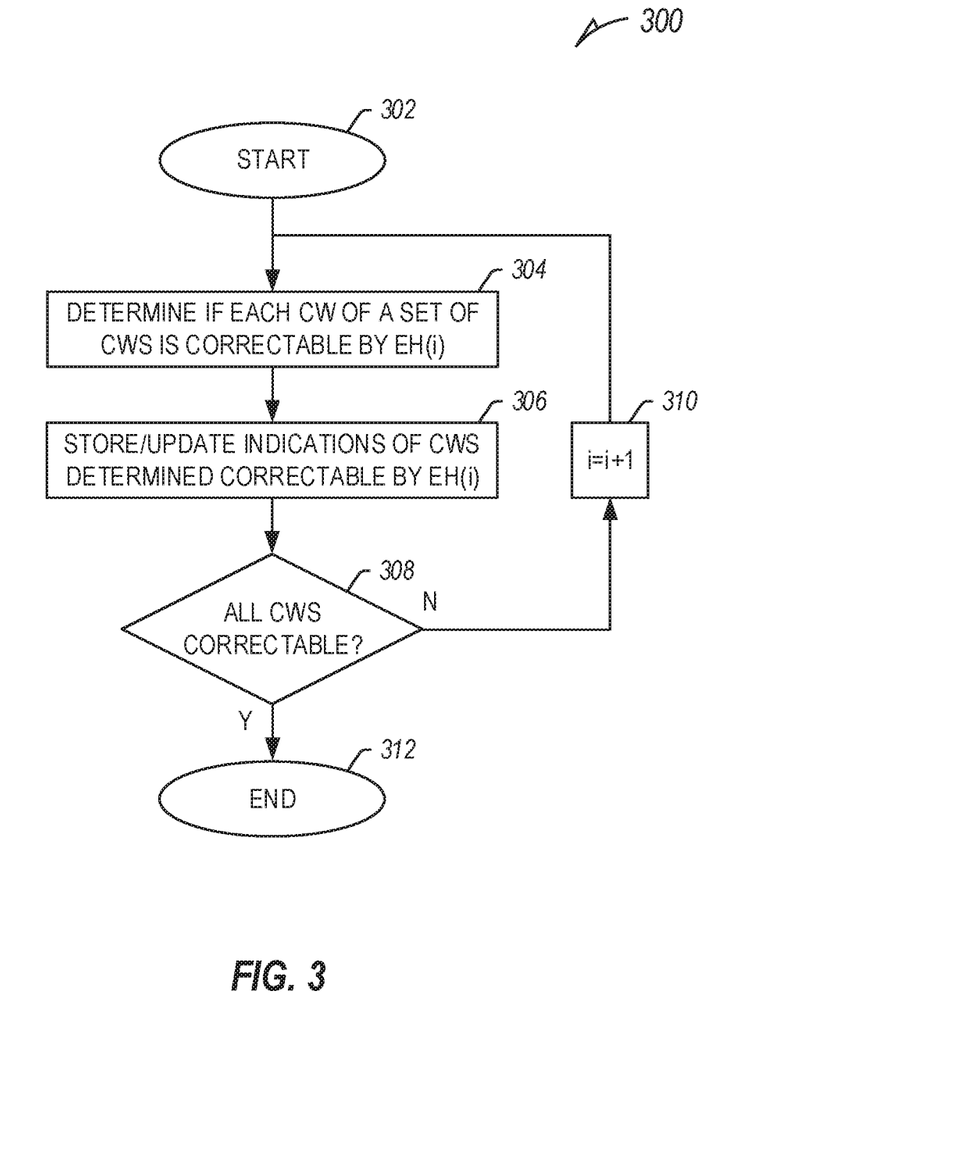
FIG. 3 illustrates an example method of performing read error recovery in a storage system.

FIG. 3 illustrates an example method 300 of performing read error recovery in a storage system. At 302, the method 300 can start. In an example, the method 300 can include maintaining, using control circuitry of a storage system, an error recovery data structure in the storage system for a set of codewords (CWs) associated with one or more memory operations of the storage system, and performing error recovery for the set of CWs using a set of error handing (EH) steps until each CW of the set of CWs are indicated as correctable in the error recovery data structure. In an example, the set of CWs can include one or more CWs associated with a memory operation (e.g., a read operation, garbage collection, drive management, etc.) having one or more detected errors (e.g., read errors). For example, one or more CWs can be detected as having one or more errors in response to a read command comprising the one or more CWs. The set of CWs can include the one or more CWs having the detected one or more errors. In an example, maintaining the error recovery data structure can include initializing the data structure and storing or updating values in the error recovery data structure.

In an example, at 302, the error recovery data structure can be initialized. The error recovery data structure can include a table, such as illustrated in FIG. 2, or in other examples, a bitmap, or one or more other data structures configured to be stored on the storage system. The error recovery data structure can include an entry for each CW of the set of CWs. In an example, initializing the error recovery data structure can include setting each entry for each CW of the set of CWs to an initial value.

At 304, each CW of the set of CWs are determined as correctable (or not correctable) by a specific EH step, EH(i), of the set of EH steps. At 306, indications of CWs determined correctable by the specific EH step, EH(i), can be stored or updated, such as in the error recovery data structure.

At 308, if all CWs are determined correctable in the error recovery data structure, such as in response to the CWs determined as correctable at 304, or stored or updated at 306, the method 300 can end at 312. If, at 308, all CWs are not determined correctable in the error recovery data structure, the specific EH step, EH(i), can be incremented at 310 to another of the set of EH steps (e.g., i=i+1). In an example, the specific EH step, EH(i), can be incremented while (i) is less than the number of EH steps (n) in the set of EH steps (e.g., while i<n).

In an example, CWs determined correctable by the specific EH step, such as using the control circuitry, can be transferred to one or more buffers of the storage system, such as in static memory, etc. In an example, each CW from the set of CWs can have a specific buffer. In other examples, a single buffer can store more than one CW. In certain examples, CWs determined correctable by the specific EH step can be removed from the set of CWs after they are determined correctable and transferred, such as prior to or commensurate with incrementing the specific EH step or determining if each CW of the set of CWs is correctable by the incremented EH step.

Figure 4:
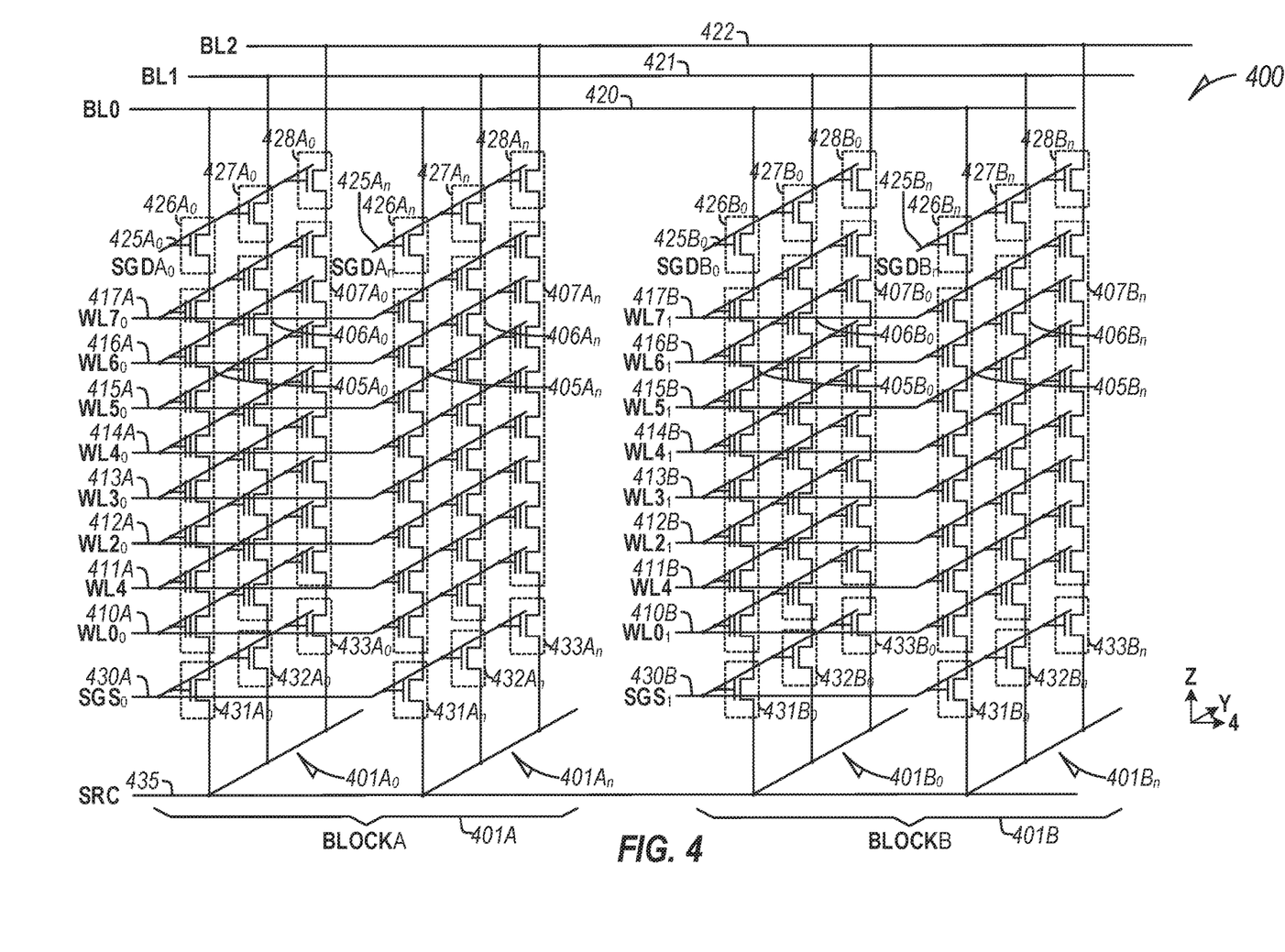
FIG. 4 illustrates an example schematic diagram of a 3D NAND architecture semiconductor memory array.

FIG. 4 illustrates an example schematic diagram of a 3D NAND architecture semiconductor memory array 400 including multiple groups of memory cells. In an example, the multiple groups can include multiple strings of memory cells (e.g., first-third $A_0$ memory strings $405A_0$-$407A_0$, first-third $A_n$ memory strings $405A_n$-$407A_n$, first-third $B_0$ memory strings $405B_0$-$407B_0$, first-third $B_n$ memory strings $405B_n$-$407B_n$, etc.), organized in blocks (e.g., block A 401A, block B 401B, etc.) and sub-blocks (e.g., sub-block $A_0$ 401$A_0$, sub-block $A_n$ 401$A_n$, sub-block $B_0$ 401$B_0$, sub-block $B_n$ 401$B_n$, etc.). The memory array 400 represents a portion of a greater number of similar structures that would typically be found in a block, device, or other unit of a memory device or storage system.

Each string of memory cells includes multiple tiers of storage transistors (e.g., floating gate, replacement gate, charge trapping structures, etc.) stacked in the Z direction, source to drain, between a source line (SRC) 435 or a source-side select gate (SGS) (e.g., first-third $A_0$ SGS $431A_0$-$433A_0$, first-third $A_n$ SGS $431A_n$-$433A_n$, first-third $B_0$ SGS $431B_0$-$433B_0$, first-third $B_n$ SGS $431B_n$-$433B_n$, etc.) and a drain-side select gate (SGD) (e.g., first-third $A_0$ SGD $426A_0$-$428A_0$, first-third $A_n$ SGD $426A_n$-$428A_n$, first-third $B_0$ SGD $426B_0$-$428B_0$, first-third $B_n$ SGD $426B_n$-$428B_n$, etc.). Each string of memory cells in the 3D memory array can be arranged along the X direction as data lines (e.g., bit lines (BL) BL0-BL3 420-422), and along the Y direction as physical pages.

Within a physical page, each tier represents a row of memory cells, and each string of memory cells represents a column. A sub-block can include one or more physical pages. A block can include multiple sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 400 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the storage transistors (e.g., select gates, data lines, etc.), as desired.

Each memory cell in the memory array 400 includes a control gate (CG) coupled to (e.g., electrically or otherwise operatively connected to) an access line (e.g., word lines (WL) $WL0_0$-$WL7_0$ 410A-417A, $WL0_1$-$WL7_1$ 410B-417B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $426A_0$-$428A_0$ can be accessed using an $A_0$ SGD line $SGDA_0$ $425A_0$, first-third $A_n$ SGD $426A_n$-$428A_n$ can be accessed using an $A_n$ SGD line $SGDA_n$ $425A_n$, first-third $B_0$ SGD $426B_0$-$428B_0$ can be accessed using a $B_0$ SGD line $SGDB_0$ $425B_0$, and first-third $B_n$ SGD $426B_n$-$428B_n$ can be accessed using a $B_n$ SGD line $SGDB_n$ $425B_n$. First-third $A_0$ SGS $431A_0$-$433A_0$ and first-third $A_n$ SGS $431A_n$-$433A_n$ can be accessed using a gate select line $SGS_0$ 430A, and first-third $B_0$ SGS $431B_0$-$433B_0$ and first-third $B_n$ SGS $4318_n$-$433B_n$ can be accessed using a gate select line $SGS_1$ 430B.

In an example, the memory array 400 can include multiple levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

In operation, data is typically written to or read from the storage system in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include multiple bytes of user data (e.g., a data payload including multiple sectors of data) and its corresponding metadata, the size of the page often refers only to the number of bytes used to store the user data. As an example, a page of data having a page size of 4 kB may include 4 kB of user data (e.g., 8 sectors assuming a sector size of 512 B) as well as multiple bytes (e.g., 32 B, 54 B, 224 B, etc.) of auxiliary or metadata corresponding to the user data, such as integrity data (e.g., error detecting or correcting code data), address data (e.g., logical address data, etc.), or other metadata associated with the user data.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_3$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_3$ and $WL5_0$, a pass voltage of 8V can be applied to $WL2_0$ and $WL6_0$, a pass voltage of 7V can be applied to $WL1_0$ and $WL7_3$, etc. In other examples, the pass voltages, or number of word lines, etc., can be higher or lower, or more or less.

Data is often stored arbitrarily on the storage system as small units. Even if accessed as a single unit, data can be received in small, random 4-16 k single file reads (e.g., 60% 80% of operations are smaller than 16 k). It is difficult for a user and even kernel applications to indicate that data should be stored as one sequential cohesive unit. File systems are typically designed to optimize space usage, and not sequential retrieval space. Sense amplifiers can be coupled to one or more of the data lines (e.g., first, second, or third bit lines (BL0-BL2) 420-422), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
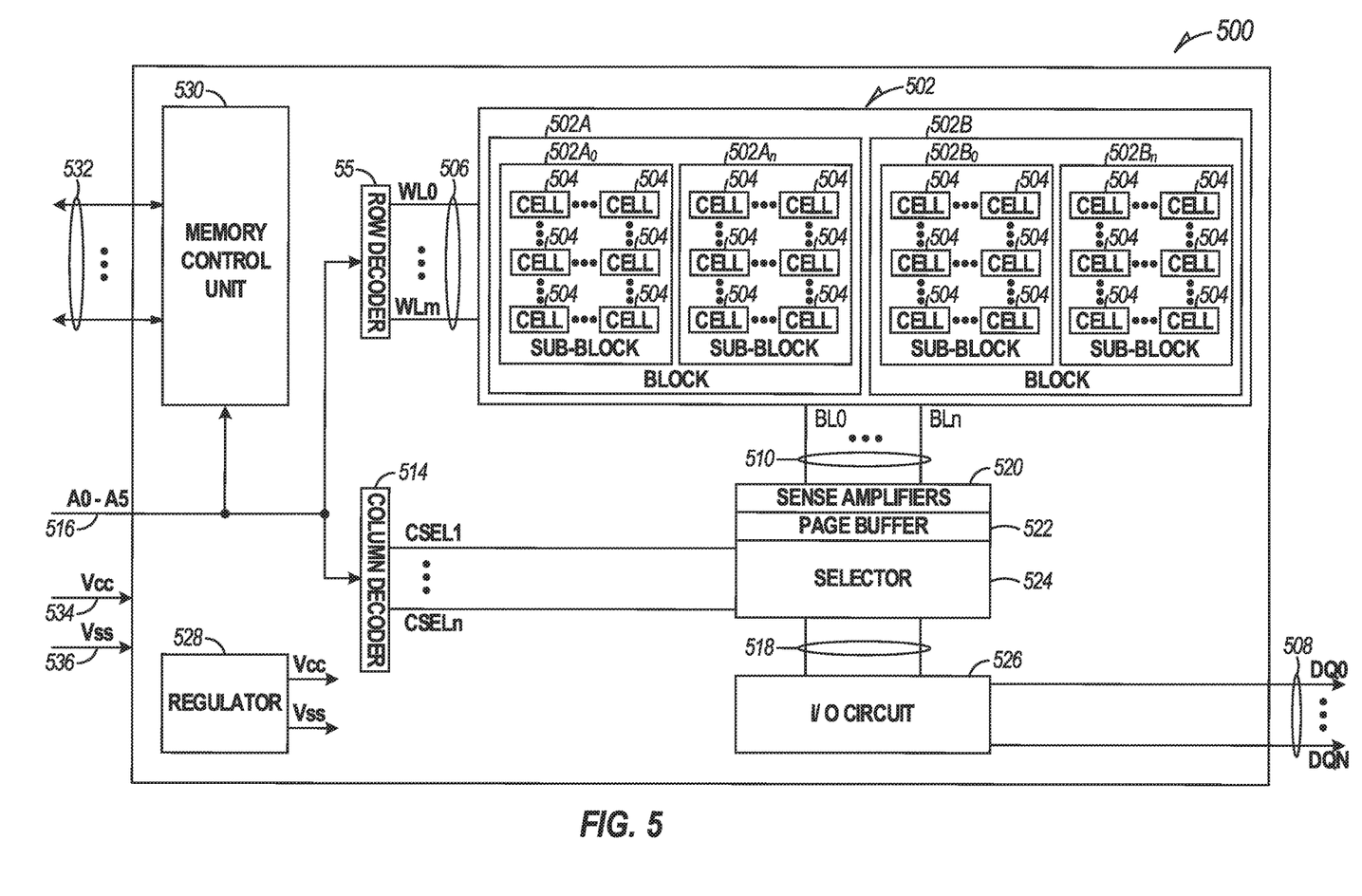
FIG. 5 illustrates an example block diagram of a memory device.

FIG. 5 illustrates an example block diagram of a storage system 500 including a memory array 502 having a plurality of memory cells 504, and one or more circuits or components to provide communication with, or perform one or more memory operations on, the memory array 502. Although shown with a single memory array 502, in other examples, one or more additional memory arrays, dies, or LUNs can be included herein. In certain examples, in a storage system having multiple dies or LUNs, the storage system 500 can represent a block diagram of circuits and components for each die or LUN. The storage system 500 can include a row decoder 512, a column decoder 514, sense amplifiers 520, a page buffer 522, a selector 524, an input/output (I/O) circuit 526, and a memory control unit 530.

The memory cells 504 of the memory array 502 can be arranged in blocks, such as first and second blocks 502A, 502B. Each block can include sub-blocks. For example, the first block 502A can include first and second sub-blocks $502A_0$, $502A_n$, and the second block 502B can include first and second sub-blocks $502B_0$, $502B_n$. Each sub-block can include multiple physical pages, each page including multiple memory cells 504. Although illustrated herein as having two blocks, each block having two sub-blocks, and each sub-block having multiple memory cells 504, in other examples, the memory array 502 can include more or fewer blocks, sub-blocks, memory cells, etc. In other examples, the memory cells 504 can be arranged in multiple rows, columns, pages, sub-blocks, blocks, etc., and accessed using, for example, access lines 506, first data lines 510, or one or more select gates, source lines, etc.

The memory control unit 530 can control memory operations of the storage system 500 according to one or more signals or instructions received on control lines 532, including, for example, one or more clock signals or control signals that indicate a desired operation (e.g., write, read, erase, etc.), or address signals (A0-AX) received on one or more address lines 516. One or more devices external to the storage system 500 can control the values of the control signals on the control lines 532, or the address signals on the address line 516. Examples of devices external to the storage system 500 can include, but are not limited to, a host, a memory controller, a processor, or one or more circuits or components not illustrated in FIG. 5.

The storage system 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The storage system 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the storage system 500 can communicate with the storage system 500 using the I/O lines (DQ0-DQN) 508, address lines 516 (A0-AX), or control lines 532. The input/output (I/O) circuit 526 can transfer values of data in or out of the storage system 500, such as in or out of the page buffer 522 or the memory array 502, using the I/O lines 508, according to, for example, the control lines 532 and address lines 516. The page buffer 522 can store data received from the one or more devices external to the storage system 500 before the data is programmed into relevant portions of the memory array 502, or can store data read from the memory array 502 before the data is transmitted to the one or more devices external to the storage system 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory control unit 530 can include a regulator 528 to internally provide positive or negative supply signals.

Figure 6:
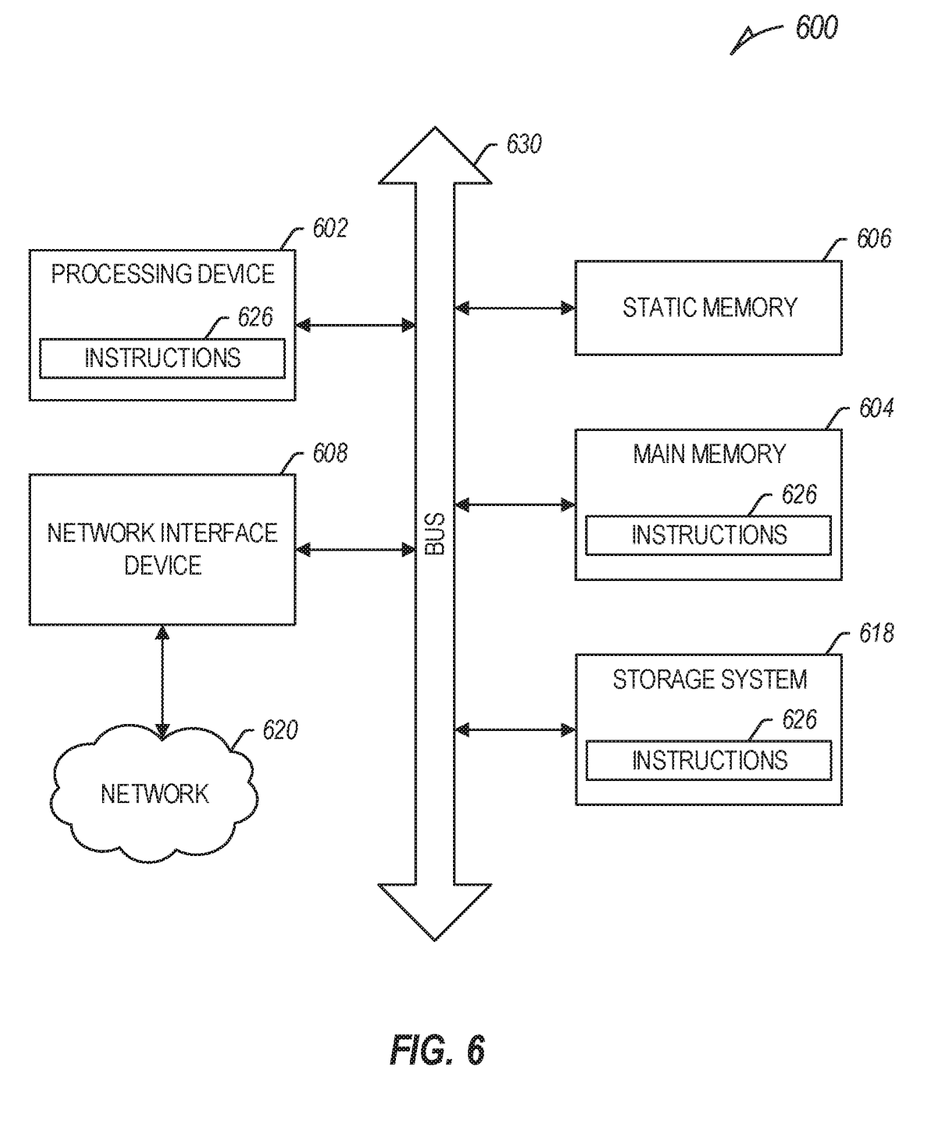
FIG. 6 illustrates a block diagram of an example machine upon which any one or more of the techniques (e.g., methodologies) discussed herein may perform.

FIG. 6 illustrates a block diagram of an example machine (e.g., a host system) 600 upon which any one or more of the techniques (e.g., methodologies) discussed herein may perform (e.g., such as those described in FIG. 1, etc.). In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of multiple transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a storage system, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the storage system as they occur, tracking the operations of the storage system it initiates, evaluating the storage system characteristics corresponding to a wear state, etc.)

According to one or more embodiments of the present disclosure, a memory access device may be configured to provide wear cycle information to the storage system with each memory operation. The storage system control circuitry (e.g., control logic) may be programmed to compensate for storage system performance changes corresponding to the wear cycle information. The storage system may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 is a system comprising: a storage system comprising control circuitry and a memory array having multiple groups of memory cells, wherein the control circuitry is configured to: maintain an error recovery data structure in the storage system for a set of codewords (CWs) associated with one or more memory operations; and perform error recovery for the set of CWs using a set of multiple error handling (EH) steps until each CW of the set of CWs are indicated as correctable in the error recovery data structure, the error recovery comprising: determine if each CW of the set of CWs is correctable by a specific EH step; store indications of the CWs determined correctable by the specific EH step in the error recovery data structure; determine if one or more CW in the set of CWs are not indicated as correctable in the error recovery data structure; and in response to determining that one or more CW in the set of CWs are not indicated as correctable in the error recovery data structure, increment the specific EH step.

In Example 2, the subject matter of Example 1 optionally includes wherein, to maintain the error recovery data structure, the control circuitry is configured to initialize the error recovery data structure having an entry for each CW of the set of CWs to an initial value, and wherein, to store indications of the CWs determined correctable by the specific EH step, the control circuitry is configured to update values for each CW of the set of CWs in the error recovery data structure.

In Example 3, the subject matter of any one or more of Examples 1-2 optionally include wherein, to increment the specific EH step, the control circuitry is configured to: determine if each CW of the set of CWs is correctable by the incremented EH step; store indications of the CWs determined correctable by the incremented EH step in the error recovery data structure; and determine if one or more CW in the set of CWs are not indicated as correctable in the error recovery data structure; and in response to determining that one or more CW in the set of CWs are not indicated as correctable in the error recovery data structure, increment the incremented EH step.

In Example 4, the subject matter of any one or more of Examples 1-3 optionally include wherein, to perform error recovery for the set of CWs, the control circuitry is configured to perform error recovery using a first EH step from the set of EH steps, wherein, to determine if each CW of the set of CWs is correctable by the EH step, the control circuitry is configured to determine if each CW of the set of CWs is correctable by the first EH step, wherein, to store the indications of the CWs determined correctable by the EH step in the error recovery data structure, the control circuitry is configured to store indications of the CWs determined correctable by the first EH step in the error recovery data structure, and wherein, in response to determining that one or more CW in the set of CWs are not indicated as correctable in the error recovery data structure, the control circuitry is configured to increment the first EH step to a second EH step.

In Example 5, the subject matter of any one or more of Examples 1-4 optionally include wherein the control circuitry is configured to perform memory operations, wherein, in performing one or more memory operations, the control circuitry is configured to detect one or more errors in one or more CWs stored in the memory array, and wherein the set of CWs comprises CWs having one or more detected errors.

In Example 6, the subject matter of any one or more of Examples 1-5 optionally include wherein the error recovery data structure includes a bitmap having a single value for each of the set of CWs.

In Example 7, the subject matter of any one or more of Examples 1-6 optionally include wherein the storage system comprises one or more buffers configured to store corrected CWs, and wherein the control circuitry is configured to transfer CWs determined correctable by the specific EH step to the one or more buffers.

In Example 8, the subject matter of Example 7 optionally includes wherein the control circuitry is configured to remove CWs determined correctable by the specific EH step from the set of CWs.

In Example 9, the subject matter of any one or more of Examples 1-8 optionally include wherein the control circuitry is configured to perform each step in the order presented.

Example 10 is a method comprising: maintaining, using control circuitry of a storage system, an error recovery data structure in the storage system for a set of codewords (CWs) associated with one or more memory operations of the storage system; performing error recovery for the set of CWs using a set of multiple error handing (EH) steps until each CW of the set of CWs are indicated as correctable in the error recovery data structure, wherein performing error recovery comprises: determining, for a first EH step of the set of multiple EH steps, if each CW of the set of CWs is correctable by the first EH step; storing indications of CWs determined correctable by the first EH step in the error recovery data structure; and determining if one or more CW in the set of CWs are not indicated as correctable in the error recovery data structure; and in response to the determining that one or more CW in the set of CWs are not indicated as correctable in the error recovery data structure, incrementing the first EH step to a second EH step of the set of multiple EH steps; and determining, for the second EH step, if each CW of the set of CWs is correctable by the first EH step; and storing indications of CWs determined correctable by the first or second EH steps in the error recovery data structure.

In Example 11, the subject matter of Example 10 optionally includes wherein maintaining the error recovery data structure comprises initializing the error recovery data structure having an entry for each CW of the set of CWs to an initial value, and wherein storing indications of the CWs determined correctable by the specific EH step comprise updating the initial values for each CW of the set of CWs in the error recovery data structure.

In Example 12, the subject matter of any one or more of Examples 10-11 optionally include detecting one or more errors in one or more CWs stored in the storage system, wherein maintaining the error recovery data structure comprises maintaining an error recovery bitmap having a single value for each of a set of CWs having one or more detected errors.

In Example 13, the subject matter of any one or more of Examples 10-12 optionally include wherein the error recovery data structure includes a bitmap having a single value for each of the set of CWs.

In Example 14, the subject matter of any one or more of Examples 10-13 optionally include transferring CWs determined correctable by the set of EH step to one or more buffers of the storage system.

In Example 15, the subject matter of Example 14 optionally includes removing CWs determined correctable by the set of EH step from the set of CWs.

In Example 16, subject matter (e.g., a system or apparatus) may optionally combine any portion or combination of any portion of any one or more of Examples 1-45 to comprise "means for" performing any portion of any one or more of the functions or methods of Examples 1-15, or at least one "non-transitory machine-readable medium" including instructions that, when performed by a machine, cause the machine to perform any portion of any one or more of the functions or methods of Examples 1-15.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
    a storage system comprising control circuitry and a memory array having multiple groups of memory cells, wherein the control circuitry is configured to:
        maintain an error recovery data structure in the storage system for a set of codewords (CWs) associated with one or more memory operations; and
        perform error recovery for the set of CWs using a set of multiple error handling (EH) steps until each CW of the set of CWs are indicated as correctable in the error recovery data structure, the error recovery comprising:
            determine if each CW of the set of CWs is correctable by a specific EH step;
            store indications of the CWs determined correctable by the specific EH step in the error recovery data structure;
            determine if one or more CW in the set of CWs are not indicated as correctable in the error recovery data structure; and
            in response to determining that one or more CW in the set of CWs are not indicated as correctable in the error recovery data structure, increment the specific EH step.

2. The system of claim 1, wherein, to increment the specific EH step, the control circuitry is configured to:
    determine if each CW of the set of CWs is correctable by the incremented EH step;
    store indications of the CWs determined correctable by the incremented EH step in the error recovery data structure; and
    determine if one or more CW in the set of CWs are not indicated as correctable in the error recovery data structure; and
    in response to determining that one or more CW in the set of CWs are not indicated as correctable in the error recovery data structure, increment the incremented EH step.

3. The system of claim 1, wherein, to perform error recovery for the set of CWs, the control circuitry is configured to perform error recovery using a first EH step from the set of EH steps,
    wherein, to determine if each CW of the set of CWs is correctable by the EH step, the control circuitry is configured to determine if each CW of the set of CWs is correctable by the first EH step,
    wherein, to store the indications of the CWs determined correctable by the EH step in the error recovery data structure, the control circuitry is configured to store indications of the CWs determined correctable by the first EH step in the error recovery data structure, and
    wherein, in response to determining that one or more CW in the set of CWs are not indicated as correctable in the error recovery data structure, the control circuitry is configured to increment the first EH step to a second EH step.

4. The system of claim 1, wherein, to maintain the error recovery data structure, the control circuitry is configured to initialize the error recovery data structure having an entry for each CW of the set of CWs to an initial value, and
    wherein, to store indications of the CWs determined correctable by the specific EH step, the control circuitry is configured to update values for each CW of the set of CWs in the error recovery data structure.

5. The system of claim 1, wherein the control circuitry is configured to perform memory operations,
    wherein, in performing one or more memory operations, the control circuitry is configured to detect one or more errors in one or more CWs stored in the memory array, and
    wherein the set of CWs comprises CWs having one or more detected errors.

6. The system of claim 1, wherein the error recovery data structure includes a bitmap having a single value for each of the set of CWs.

7. The system of claim 1, wherein the storage system comprises one or more buffers configured to store corrected CWs, and
    wherein the control circuitry is configured to transfer CWs determined correctable by the specific EH step to the one or more buffers.

8. The system of claim 7, wherein the control circuitry is configured to remove CWs determined correctable by the specific EH step from the set of CWs.

9. The system of claim 1, wherein the control circuitry is configured to perform each step in the order presented.

10. A method comprising:
    maintaining, using control circuitry of a storage system, an error recovery data structure in the storage system for a set of codewords (CWs) associated with one or more memory operations of the storage system;
    performing error recovery for the set of CWs using a set of multiple error handing (EH) steps until each CW of the set of CWs are indicated as correctable in the error recovery data structure, wherein performing error recovery comprises:
    determining, for a first EH step of the set of multiple EH steps, if each CW of the set of CWs is correctable by the first EH step;
    storing indications of CWs determined correctable by the first EH step in the error recovery data structure;
    determining if one or more ON in the set of CWs are not indicated as correctable in the error recovery data structure;
    in response to the determining that one or more CW in the set of CWs are not indicated as correctable in the error recovery data structure, incrementing the first EH step to a second EH step of the set of multiple EH steps;
    determining, for the second EH step, if each CW of the set of CWs is correctable by the first EH step; and
    storing indications of CWs determined correctable by the first or second EH steps in the error recovery data structure.

11. The method of claim 10, wherein maintaining the error recovery data structure comprises initializing the error recovery data structure having an entry for each CW of the set of CWs to an initial value, and
    wherein storing indications of the CWs determined correctable by the specific EH step comprise updating the initial values for each CW of the set of CWs in the error recovery data structure.

12. The method of claim 10, comprising:
    detecting one or more errors in one or more CWs stored in the storage system,
    wherein maintaining the error recovery data structure comprises maintaining an error recovery bitmap having a single value for each of a set of CWs having one or more detected errors.

13. The method of claim 10, wherein the error recovery data structure includes a bitmap having a single value for each of the set of CWs.

14. The method of claim 10, comprising transferring CWs determined correctable by the set of EH step to one or more buffers of the storage system.

15. The method of claim 14, comprising removing CWs determined correctable by the set of EH step from the set of CWs.

16. A non-transitory device-readable storage medium comprising instructions that, when executed by controller circuitry of a storage system, cause the storage system to perform operations comprising:
    maintaining, an error recovery data structure in the storage system for a set of codewords (CWs) associated with one or more memory operations of the storage system;
    performing error recovery for the set of CWs using a set of multiple error handing (EH) steps until each CW of the set of CWs are indicated as correctable in the error recovery data structure, wherein performing error recovery comprises:
        determining, for a first EH step of the set of multiple EH steps, if each CW of the set of CWs is correctable by the first EH step;
        storing indications of CWs determined correctable by the first EH step in the error recovery data structure;
        determining if one or more CW in the set of CWs are not indicated as correctable in the error recovery data structure;
        in response to the determining that one or more CW in the set of CWs are not indicated as correctable in the error recovery data structure, incrementing the first EH step to a second EH step of the set of multiple EH steps;
        determining, for the second EH step, if each CW of the set of CWs is correctable by the first EH step; and
        storing indications of CWs determined correctable by the first or second EH steps in the error recovery data structure.

17. The non-transitory device-readable storage medium of claim 16, wherein maintaining the error recovery data structure comprises initializing the error recovery data structure having an entry for each CW of the set of CWs to an initial value, and
    wherein storing indications of the CWs determined correctable by the specific EH step comprise updating the initial values for each CW of the set of CWs in the error recovery data structure.

18. The non-transitory device-readable storage medium of claim 16, wherein the instructions that, when executed by controller circuitry of a storage system, cause the storage system to perform operations comprise:
    detecting one or more errors in one or more CWs stored in the storage system,
    wherein maintaining the error recovery data structure comprises maintaining an error recovery bitmap having a single value for each of a set of CWs having one or more detected errors.

19. The non-transitory device-readable storage medium of claim 16, wherein the error recovery data structure includes a bitmap having a single value for each of the set of CWs.

* * * * *